(12) United States Patent
Teng

(10) Patent No.: US 7,634,597 B2
(45) Date of Patent: Dec. 15, 2009

(54) ALIGNMENT OF INSTRUCTIONS AND REPLIES ACROSS MULTIPLE DEVICES IN A CASCADED SYSTEM, USING BUFFERS OF PROGRAMMABLE DEPTHS

(75) Inventor: Tom Teng, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 591 days.

(21) Appl. No.: 10/680,171

(22) Filed: Oct. 8, 2003

(65) Prior Publication Data

US 2005/0080951 A1    Apr. 14, 2005

(51) Int. Cl.
*G06F 3/00* (2006.01)

(52) U.S. Cl. ....................................................... 710/52
(58) Field of Classification Search .................... 710/52
See application file for complete search history.

(56) References Cited

U.S. PATENT DOCUMENTS

| | | | | |
|---|---|---|---|---|
| 5,640,515 | A | * | 6/1997 | Park ............................. 710/52 |
| 5,673,396 | A | * | 9/1997 | Smolansky et al. .......... 710/307 |
| 5,930,359 | A | * | 7/1999 | Kempke et al. .............. 713/160 |
| 5,956,492 | A | * | 9/1999 | Jander et al. ................. 710/106 |
| 5,978,355 | A | * | 11/1999 | Yamaguchi ............... 370/395.7 |
| 6,233,250 | B1 | * | 5/2001 | Liu et al. .................... 370/469 |
| 6,606,666 | B1 | * | 8/2003 | Bell et al. ................... 709/232 |
| 7,058,757 | B1 | * | 6/2006 | Branth et al. ............... 711/108 |
| 2004/0022082 | A1 | * | 2/2004 | Khanna ....................... 365/49 |
| 2004/0024960 | A1 | * | 2/2004 | King et al. .................. 711/108 |
| 2007/0299993 | A1 | * | 12/2007 | Vorbach et al. ............... 710/53 |

OTHER PUBLICATIONS

Vorbach et al., WO02071249, Method and Devices for Treating and/or Processing Data—(machine translation), pp. 9-10.*

* cited by examiner

*Primary Examiner*—Alford Kindred
*Assistant Examiner*—David E Martinez
(74) *Attorney, Agent, or Firm*—Dickstein Shapiro LLP

(57) ABSTRACT

Buffers of programmable depths are used in the instruction and reply paths of cascaded devices to account for possible differences in latencies between the devices. The buffers may be enabled or bypassed such that the alignment of instruction and result may be performed at the boundaries between separate groups of devices having different instruction latencies.

9 Claims, 10 Drawing Sheets

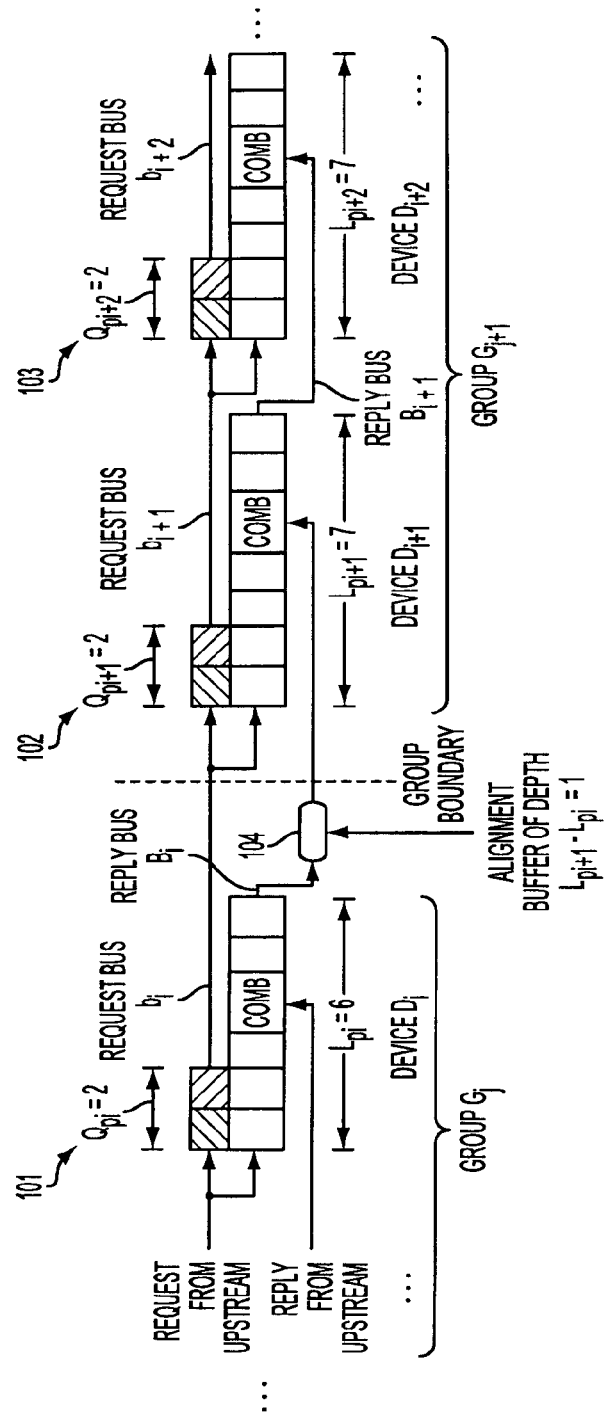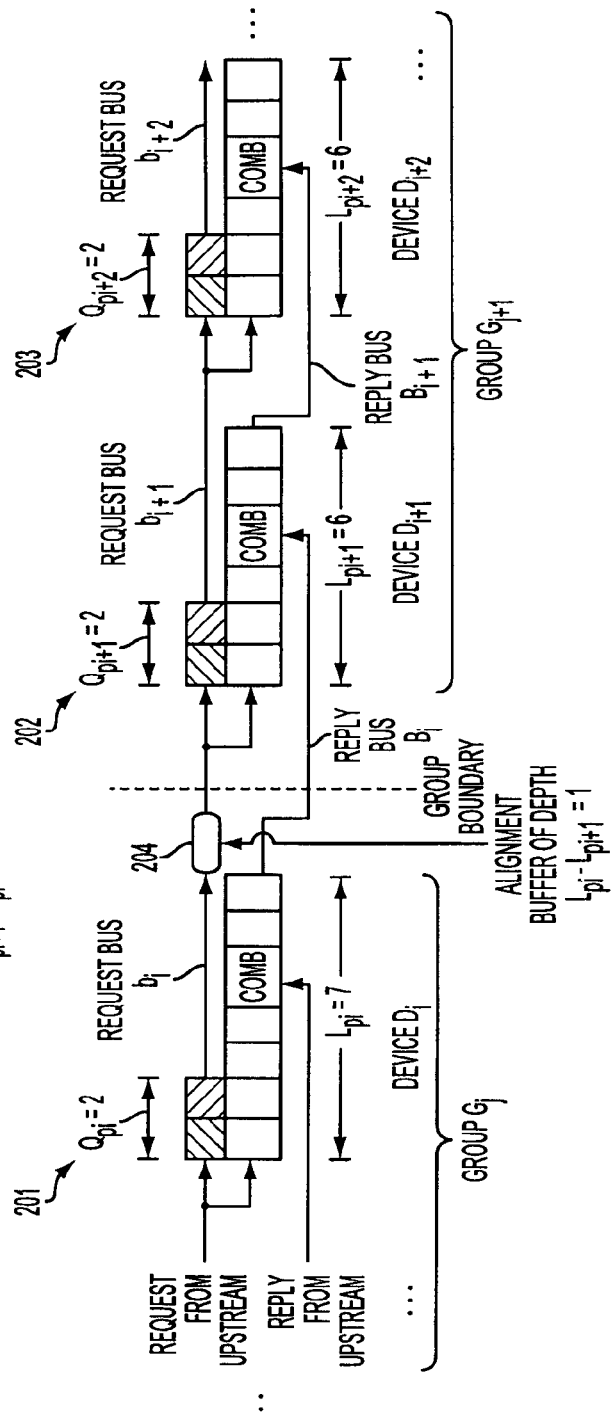

ALIGNMENT OF INSTRUCTIONS AND REPLIES ACROSS MULTIPLE DEVICES IN A CASCADED SYSTEM, USING BUFFERS OF PROGRAMMABLE DEPTHS

FIELD OF THE INVENTION

The present invention relates generally to cascaded devices in a system, and more particularly to accounting for possible differences in latencies across the devices.

BACKGROUND OF THE INVENTION

A pipelined device $D_i$ uses a single output bus port $B_i$ for sending out the results of a set of operations $M_i$ in response to a sequence of input request instructions. In order to avoid multiple pipelined operations within $D_i$ from sending out their results onto bus $B_i$ in the same cycle (leading to signal contention on $B_i$), the operations in the set of operations $M_i$ in device $D_i$ should have the same instruction latency from device input to output, so that only one result is output per cycle in the same sequence as the corresponding requests. This instruction latency for device $D_i$ is denoted as $Lp_i$.

A group of n pipelined devices are cascaded together synchronously in a chain and described as $D_0$->$D_1$-> . . . ->$D_i$->$D_{i+1}$-> . . . ->$D_{n-1}$. In the cascaded system, device $D_i$ is coupled to device $D_{i+1}$ via a request output bus $b_i$ and a reply output bus $B_i$ (together denoted by the arrows) for all i in $0 \leq i \leq n-2$. Device $D_i$ forwards an input request R on request output bus $b_i$ to its immediate downstream device $D_{i+1}$ after $Qp_i$ cycles, where $Qp_i$ is the request forwarding latency for device $D_i$. Device $D_i$ forwards the result of its operation for request R to device $D_{i+1}$ on reply output bus $B_i$ after $Lp_i$ cycles. In general, $Qp_i$ is nonzero, as a finite time is required for input/output operations and to propagate the input request across chip to the output request port. For the reply path, similar overhead expenses are also present and contribute to the instruction latency $Lp_i$. The clocks that are distributed to the cascaded devices are assumed to have the same frequency (within design/process tolerance) and well-defined phase relations.

When device $D_{i+1}$ receives the result from its immediate upstream device $D_i$, $D_{i+1}$ combines this result with its own result to request R. Device $D_{i+1}$ receives the request R on bus $b_i$. The combined response is then sent out onto bus $B_{i+1}$ to be further combined with the results of devices $D_{i+2}, \ldots, D_{n-1}$ in similar fashion. The final response from the cascaded system to the request R can be detected at the reply output bus $B_{n-1}$ of the last cascaded device.

Considering the devices $D_0, D_1, \ldots, D_{n-1}$ as stand-alone parts, in response to a given request instruction R, the devices may or may not perform the same operation(s) to fulfill the request. Each device's set of operations $M_0, M_1, \ldots, M_{n-1}$ may differ. The devices may or may not have the same instruction latency between their respective sets of operations and $Lp_0, Lp_1, \ldots, Lp_{n-1}$ may differ, although within a particular device, the instruction latency is assumed to be the same for its set of operations as indicated above. If devices with non-uniform instruction latencies are then cascaded together synchronously with no other means to align the results from different devices, then replies to different instructions could be erroneously combined. Devices in the cascade should not be merging the results of operations to different instructions during the same cycle. This would usually result in false operation of the overall system, since replies to the same instruction R are desired to be combined across the cascaded devices even though the operation(s) that each device executes to fulfill a particular instruction may differ. Using content addressable memory (CAM) devices as an example, when a search instruction is given in a request signal, all the CAM devices should be executing the search instruction. If the devices in the cascade are not synchronized due to differing latencies, one device could have a response to an instruction that preceded or followed the search instruction. This is undesirable because it is necessary for all devices to work together to formulate a search result from the individual responses of each device in the cascade.

A possible solution to avoid the unintended and erroneous combination of replies to different requests in a cascaded system is to require that the request be stalled from being forwarded until its corresponding result is ready, at which time both are forwarded to the next device in the cascade. Each downstream device waits for its immediate predecessor to complete the instruction before it starts its own operation. However, this would incur a large latency penalty for the cascaded system, on the order of n * average($Lp_0, Lp_1, \ldots, Lp_{n-1}$), where n is the number of devices in the system. In order to reduce the total latency, it is desirable that all devices forward the instruction downstream with minimum delay and execute their operation(s) for that request as soon as it is received to maximize parallelism. The results between neighboring devices can then be aligned by some means so that they may be properly combined.

To achieve this, a first solution may require that not only all operations for a particular device have the same instruction latency $Lp_i$, but also that all devices in the cascade have the same instruction latency, such that $Lp_0 = Lp_1 = \ldots = Lp_{n-1} = Lp$. In addition, the request forwarding latency of the devices is also required to be the same, so that $Qp_0 = Qp_1 = \ldots = Qp_{n-1} = Qp$, and replies between neighboring devices are combined in the same pipeline stage $Lp-Qp$ (first pipeline stage is assumed to be numbered as stage 1). Although this approach does reduce the overall latency of the system to the order of Lp (there is some extra overhead for forwarding the request instruction through the cascade), it has the limitation that the faster devices would need to uniformly insert extra pipeline stages as part of their design to match the latency of the slowest device in the cascade. This is undesirable because it leads to higher power consumption and unnecessarily larger die sizes for the faster devices. Moreover, if different devices in the cascade are designed by different vendors, all of these vendors need to agree on a common instruction and request forwarding latency, and then match the performances of their devices accordingly. Therefore, there is a desire and need to efficiently combine results calculated across multiple devices in a cascaded system, without the stringent requirement that all devices must uniformly share the same instruction latency and/or request forwarding latency.

BRIEF SUMMARY OF THE INVENTION

The invention provides techniques in which buffers are used to address the latency problem. For example, embodiments of the present invention can first cascade together into the same groups those devices that share the same instruction latencies and request forwarding latencies. These devices may be instances of the same component part, or may be designed to work compatibly in a cascade by the same vendor. Different groups in which either instruction latency or request forwarding latency varies are then cascaded together (possibly designed by different vendors) by inserting buffers of programmable depths in the request and reply cascade paths at the group boundaries, to properly align the requests and replies as they cross the boundaries. The buffers contain stages internally that may be bypassed so that their effective depths (latencies) may be adjusted (programmed) to accommodate a wide range of instruction and request forwarding latencies for the cascaded devices, and may be either on-die as part of the devices themselves, or added as discrete components to the system-board.

BRIEF DESCRIPTION OF THE DRAWINGS

The forgoing and other advantages and features of the invention will be more clearly understood from the following detailed description of the invention which is provided in connection with the accompanying drawings, in which:

FIG. 1 is a diagram showing a first embodiment of adjoining groups of devices having different instruction latencies but sharing the same request forwarding latency;

FIG. 2 is a diagram showing a second embodiment of adjoining groups of devices having different instruction latencies but sharing the same request forwarding latency;

DETAILED DESCRIPTION OF THE INVENTION

The various embodiments of the present invention use buffers of programmable depths in instruction and reply cascade paths of a device in a cascaded system to account for possible differences in latencies across the devices in the system.

A solution to the latency problem is found by observing that the alignment of reply and request outputs of a device needs to occur only at device boundaries where a difference in instruction latency and/or request forwarding latency occurs. FIG. 1 shows the case where adjoining groups have different instruction latencies but share the same request forwarding latency, with $Lp_i < Lp_{i+1}$ and $Qp_i = Qp_{i+1}$. Device $D_i$ 101, device $D_{i+1}$ 102 and device $D_{i+2}$ 103 are cascaded devices with Device $D_i$ 101 being in group $G_j$ and devices $D_{i+1}$ 102 and $D_{i+2}$ 103 in group $G_{j+1}$. Alignment buffer 104 in the reply cascaded path is of a depth $Lp_{i+1} - Lp_i = 1$. FIG. 2 shows the case where adjoining groups have different instruction latencies but share the same request forwarding latency, with $Lp_i > Lp_{i+1}$ and $Qp_i = Qp_{i+1}$. Device $D_i$ 201, device $D_{i+1}$ 202 and device $D_{i+2}$ 203 are cascaded devices with Device $D_i$ 201 being in group $G_j$ and devices $D_{i+1}$ 202 and $D_{i+2}$ 203 in group $G_{j+1}$. Alignment buffer 204 in the request cascaded path is of a depth $Lp_i - Lp_{i+1} = 1$.

Figure 3:
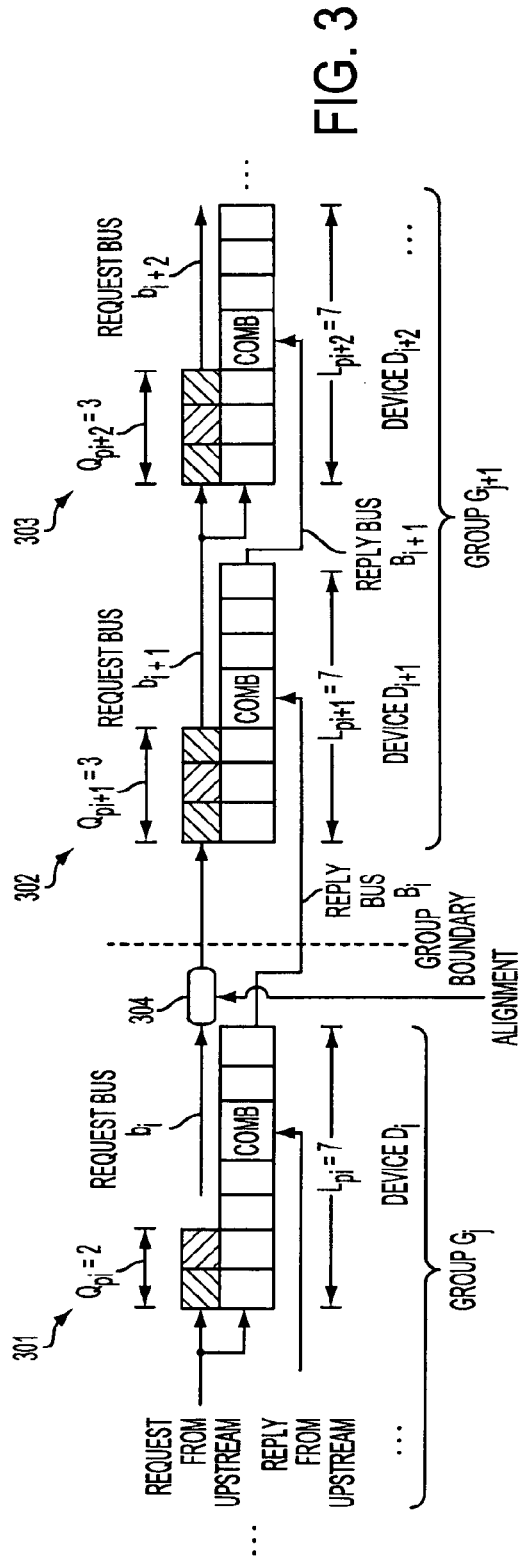
FIG. 3 is a diagram showing a first embodiment of adjoining groups of devices having different request forwarding latencies but sharing the same instruction latency.
Figure 4:
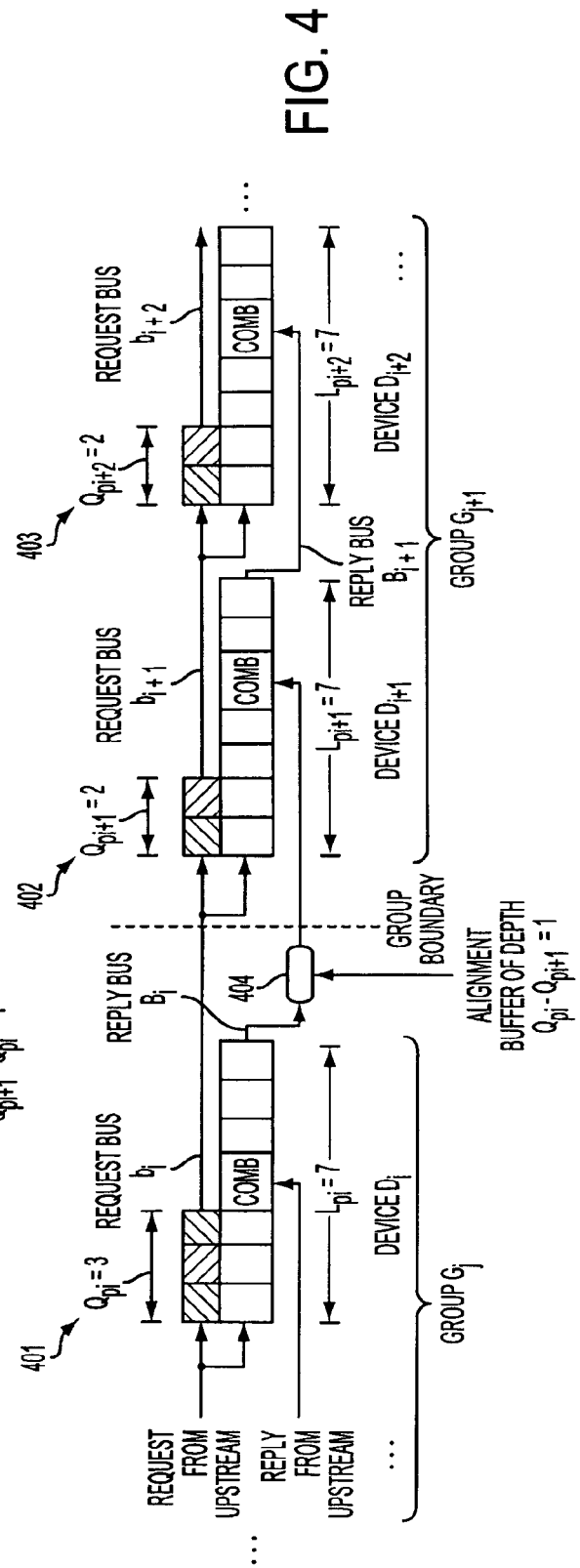
FIG. 4 is a diagram showing a second embodiment of adjoining groups of devices having different request forwarding latencies but sharing the same instruction latency.

FIG. 3 shows the case where adjoining groups have different request forwarding latencies but share the same instruction latency, with $Qp_i < Qp_{i+1}$ and $Lp_i = Lp_{i+1}$. Device $D_i$ 301, device $D_{i+1}$ 302 and device $D_{i+2}$ 303 are cascaded devices with Device $D_i$ 301 being in group $G_j$ and devices $D_{i+1}$ 302 and $D_{i+2}$ 303 in group $G_{j+1}$. Alignment buffer 304 in the request cascaded path is of a depth $Qp_{i+1} - Qp_i = 1$. FIG. 4 shows the case where adjoining groups have different request forwarding latencies but share the same instruction latency, with $Qp_i > Qp_{i+1}$ and $Lp_i = Lp_{i+1}$. Device $D_i$ 401, device $D_{i+1}$ 402 and device $D_{i+2}$ 403 are cascaded devices with Device $D_i$ 401 being in group $G_j$ and devices $D_{i+1}$ 402 and $D_{i+2}$ 403 in group $G_{j+1}$. Alignment buffer 404 in the reply cascaded path is of a depth $Qp_i - Qp_{i+1} = 1$.

In FIGS. 1-4, proper alignment of reply and request outputs of a device is attained by either inserting an adjustment buffer in the request or reply cascaded path. The case where both latencies differ would generally require buffers to be inserted into both cascaded paths, and is a combination of the cases shown in FIGS. 1-4. The placement of the result-combining pipeline stage within the devices of each group is constrained by the Lp and Qp parameters for that group, specifically located at stage Lp–Qp. The number of stages utilized in these buffers may be programmed by a host that has knowledge of the latency differences along the chain (the remaining unused stages in the buffers are bypassed). This may be accomplished in a variety of ways. One way, for example, is to read a hardwired latency register in each device. Another is to use a control circuit to program depths or delay times for the buffers.

The alignment buffers mentioned above may be introduced into the cascaded system in several ways. Compared to the requirement that all devices in the cascade have identical instruction and request forwarding latencies, the following embodiments take advantage of the possibility that some devices have better performance than others, and can lead to overall lower power consumption, smaller die size for faster devices, and increased flexibility in cascading devices with different latencies.

In a first embodiment, reply/request adjustment buffers are built into the cascaded devices themselves. Within each device, there are two sets of output buffers: one to delay the sending of the request to a downstream device, and the other to delay the sending of the reply to a downstream device. These buffers may be entirely bypassed if the downstream device has the same instruction and request forwarding latencies as the current device. By grouping together devices that have the same latencies, only the last device in the group that interfaces to another group needs to have either its output request buffer or output reply buffer enabled, such that some stages within the buffers are used to delay the outputting of request or reply, while those in other devices of the groups can be entirely bypassed. This leads to power savings in the overall cascaded system, because disabled buffers consume less power. At the same time, by allowing the depths of the buffers to be programmable such that unused buffer stages are bypassed, a greater range of instruction and request forwarding latencies in the cascade can be accommodated.

In a second embodiment, two versions of each device may be manufactured: one version which does not contain the output request and reply buffers on-die and is designed to be cascaded with those which have the same instruction and request forwarding latencies, and another version which does contain the output request and reply buffers on-die and can serve as intermediaries to cascade to other devices which have different latencies. This can lead to smaller die size for the first of the two versions, as well as overall lower power consumption and increased tolerance to performance variations among devices in the cascaded system.

In a third embodiment, the devices in the cascade do not contain output request or reply buffers. Instead, these buffers are inserted at the system-board level between groups of devices with different latencies. Again, this could lead to lower power consumption and smaller die sizes compared to a system that requires all devices to share the same latency.

The buffers which are subsequently referred to may be any of the three previously described embodiments. They may be built internally into all devices and be mostly bypassed except for those which reside within devices at group boundaries. They may alternatively only reside within specialized devices designed to interface with other groups. Or they may reside external to the devices on the system-board for the sole purpose of aligning requests/replies between different groups. It is assumed that devices within the same group have the same instruction and request latencies, but devices from different groups may not have the same instruction and request latencies.

It is assumed below that the request forwarding latency is constant across all devices in the cascade, so that the primary focus can be placed upon handling the variation in instruction latencies across cascaded devices. This is reasonable since the instruction latency has a greater consequence on the performance of a device, and varies more widely between devices. Extension to cover the case where the request forwarding latency also varies across devices is straight-forward, and proceeds as follows. Assuming first that the request forwarding latency is constant (same for all devices), but the instruction latency varies, if an upstream device $D_i$ has smaller $Lp_i$ than device $D_{i+1}$, then an alignment buffer with depth programmed to be $(Lp_{i+1}-Lp_i)$ can be inserted into the reply cascade path at $B_i$, to effectively equalize the instruction latencies of the two devices, whereas if device $D_i$ has a larger $Lp_i$ than device $D_{i+1}$, then an alignment buffer with depth programmed to be $(Lp_i-Lp_{i+1})$ can be inserted into the request cascade path at $b_i$, so that the instruction is delayed when forwarded to $D_{i+1}$. In a similar fashion, assuming now that the instruction latency is constant (same for all devices), but the request forwarding latency varies, if an upstream device $D_i$ has a smaller $Qp_i$ than device $D_{i+1}$, then an alignment buffer with depth programmed to be $(Qp_{i+1}-Qp_i)$ can be inserted into the request cascade path at bi to effectively equalize the request forwarding latencies of the two devices, whereas if device $D_i$ has a larger $Qp_i$ than device $D_{i+1}$, then an alignment buffer with depth programmed to be $(Qp_i-Qp_{i+1})$ can be inserted into the reply cascade path at $B_i$, so that the reply is delayed in getting to $D_{i+1}$. For the general case where both instruction and request forwarding latencies may vary, proper alignment may be obtained by calculating the buffer depths independently required for the two individual cases described, then adding together the buffer depths. If the calculation results reveal that both the request and reply alignment buffers have nonzero depths, then a common term can be subtracted from both such that one of them would have zero depth (entirely bypassed). The general case is illustrated in FIG. 5 for $Qp_i > Qp_{i+1}$, $Lp_i < Lp_{i+1}$ and in FIG. 6 for $Qp_i < Qp_{i+1}$, $Lp_i < Lp_{i+1}$.

Figures 5, 6:
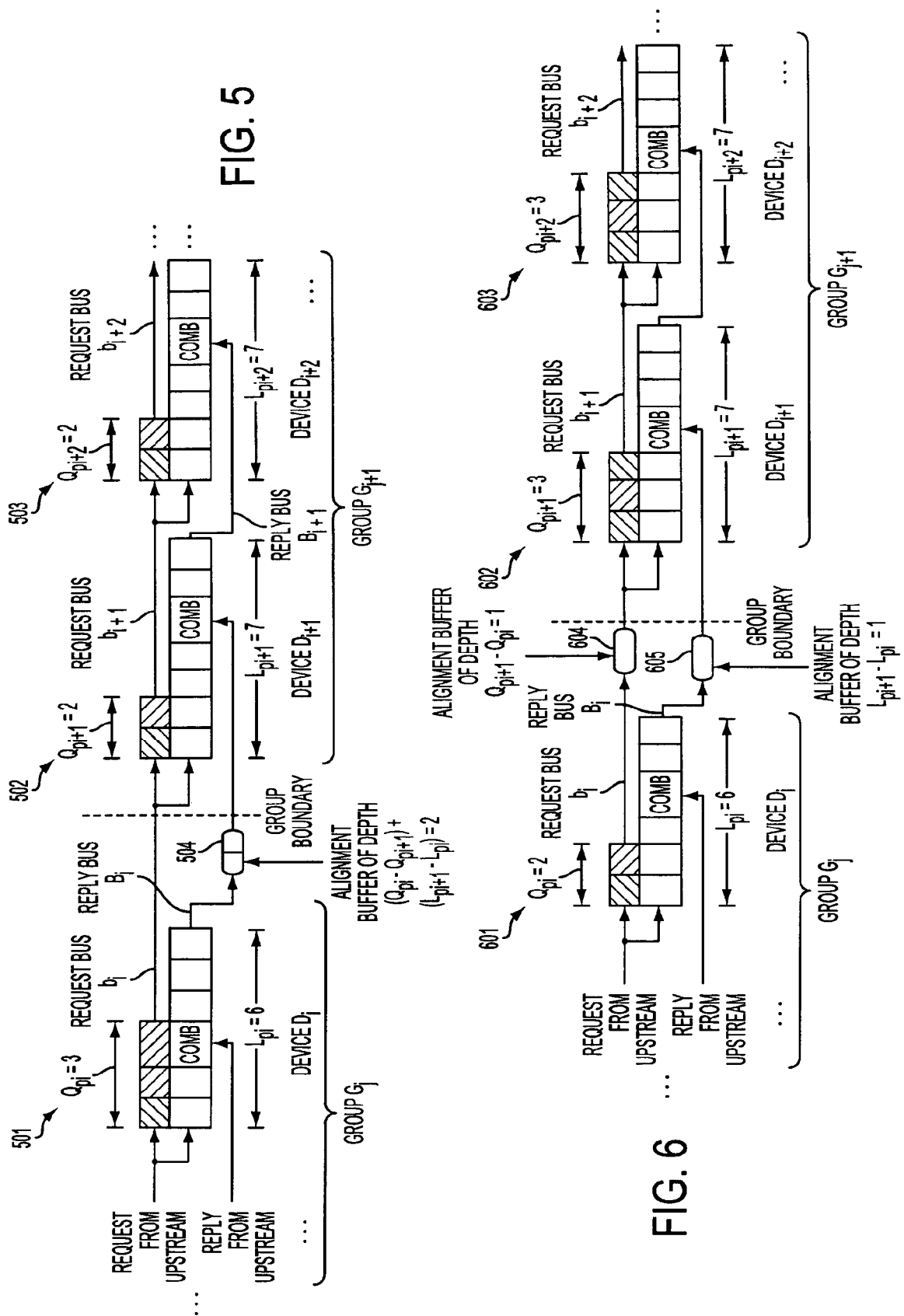
FIG. 5 is a diagram showing a first embodiment of adjoining groups of devices with varying instruction and request forwarding latencies.
FIG. 6 is a diagram showing a second embodiment of adjoining groups of devices with varying instruction and request forwarding latencies.

In FIG. 5, device $D_i$ 501, device $D_{i+1}$ 502 and device $D_{i+2}$ 503 are cascaded devices with Device $D_i$ 501 being in group $G_j$ and devices $D_{i+1}$ 502 and $D_{i+2}$ 503 in group $G_{j+1}$. Alignment buffer 504 in the reply cascaded path is of a depth $(Qp_i - Qp_{i+1}) + (Lp_{i+1} - Lp_i) = 2$. In FIG. 6, device $D_i$ 601, device $D_{i+1}$ 602 and device $D_{i+2}$ 603 are cascaded devices with Device $D_i$ 601 being in group $G_j$ and devices $D_{i+1}$ 602 and $D_{i+2}$ 603 in group $G_{j+1}$. Both alignment buffers 604 and 605 are of a depth $Lp_{i+1} - Lp_i = 1$. This yields both alignment buffers 604 and 605 to be of depth=1, so the common term of 1 may be subtracted from the depths of both buffers, yielding 0 for both. Therefore, the two buffers effectively cancel each other out, and may be entirely removed or bypassed.

Each device in the cascade has the responsibility of merging its own reply signal with the reply signal received from its immediate upstream device. By buffering the request or reply data, each device ensures that its immediate downstream device receives the request and reply data at the time it is needed. When a device $D_i$ with latency $Lp_i$ is followed by a faster device $D_{i+1}$ with a lower latency $Lp_{i+1}$, device $D_i$ buffers its output request signal. This ensures that the downstream device $D_{i+1}$ receives the correct request and reply signals for the current cycle. By buffering the request signal, the downstream device $D_{i+1}$ receives the request signal at a time such that the proper reply signal for the current request instruction, on the live cycle, is available when processing operations in device $D_{i+1}$ require its result. Similarly, when a device $D_{i+1}$ with latency $Lp_{i+1}$ is followed by a slower device $D_{i+2}$ with a higher latency $Lp_{i+2}$, device $D_{i+1}$ buffers its reply signal output. This again ensures that the downstream device $D_{i+2}$ receives the correct request and reply signals for the current cycle. By buffering the reply signal, the downstream device $D_{i+2}$ receives the request signal at a time such that the proper reply signal for the current request instruction, on the live cycle, is available when processing operations in device $D_{i+2}$ require its result.

In the case of CAM devices, when a search instruction is issued as the request signal and a downstream device $D_i$ has a lower priority than all its upstream devices, device $D_i$ has to take into account any hits (data search matches) occurring in the upstream devices in order to prioritize itself and its predecessors. It is essential that the reply signal device $D_i$ receives is a response to the request instruction of the current live cycle, and not a response to a different instruction from a previous or subsequent cycle. Therefore, buffers are used in CAM devices to match the processing of received request signals such as a search instruction request with the proper coinciding reply signal output from each devices' immediate upstream device.

Figure 7A:
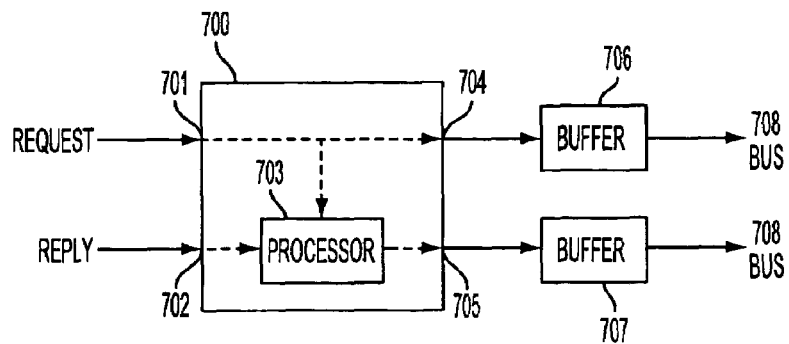
FIG. 7a is a block diagram of a pipelined device in accordance with a first exemplary embodiment of the invention.

Referring now to the drawings, wherein like reference numerals designate identical or corresponding parts throughout the several views, a first exemplary embodiment of a cascaded device is shown in FIG. 7a. A device 700 may be any device performing a set of operations on an input signal, such as, for example, a CAM device. The device 700 receives a request signal at a first input 701 and an incoming reply signal which is capable of processing search requests for stored data at a second input 702. The incoming request and reply signals presumably come from another device in a cascaded system.

If the device 700 is the first device in the cascade, then the signals are received from some other source (e.g., a host ASIC).

The device 700 has first and second outputs 704, 705. The device 700 performs a set of predetermined operations with a processor 703 and outputs an outgoing reply signal at the second output 705. The outgoing reply signal is the result of the operations performed by the processor 703 combined with the incoming reply signal at input 702. The request signal received at the first input 701 is outputted at the first output 704 of the device 700.

A first buffer 706 is coupled to the first output 704 and is programmable to buffer the output request signal. A second buffer 707 is coupled to the second output 705 and is programmable to buffer the output reply signal. The buffers 706, 707 have programmable depths, and may be configured to be bypassed. By using buffers of programmable depths, the output request signal and/or the output reply signal may pass through the buffers 706, 707, respectively, while being delayed by the buffer for a predetermined period of time. The amount of delay is dependant on the programmed buffer depth, which, as needed, also may be programmed to bypass buffering. The outputs of the device 700, which may or may not be buffered by buffers 706, 707 depending on the programmed buffer depths, are sent to an output bus 708.

As a result, the outputted request signal and the outputted reply signal of a device are not forwarded to the next downstream device in the cascaded system until a predetermined period of time has passed, where the predetermined period of time is substantially equal to the difference between the latency period of these two adjacent devices. By delaying forwarding of either the outputted request signal or the outputted reply signal by the predetermined period of time, the latency period between these two adjacent devices can be accounted for to ensure each cascaded device is processing the correct operation for the current instruction cycle.

Figure 7B:
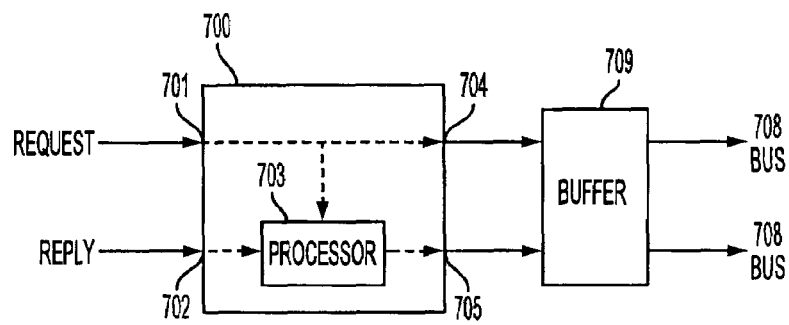
FIG. 7b is a block diagram of a pipelined device in accordance with a second exemplary embodiment of the invention.

In another exemplary embodiment of a cascaded device as shown in FIG. 7b, the two buffers 706, 707 may be implemented with a single buffer unit 709. The buffer unit 709 buffers the outputted request signal when the immediate downstream device has a lower latency than the device 700. In this first case, the immediate downstream device performs its set of operations faster than the device 700. The outputted request signal needs to be delayed or held for the period of time equivalent to the latency difference between the device 700 and the immediate downstream device. This allows for alignment of request and reply signals before they are sent to the immediate downstream device. Alternatively, the buffer unit 709 buffers the outputted reply signal when the downstream device has a higher latency than the device 700. In this second case, the immediate downstream device performs its set of operations slower than the device 700. The outputted reply signal now needs to be delayed or held for a period of time equivalent to the latency difference between the device 700 and the immediate downstream device to align the request and reply signals before sending to the immediate downstream device through bus 708.

Figure 8:
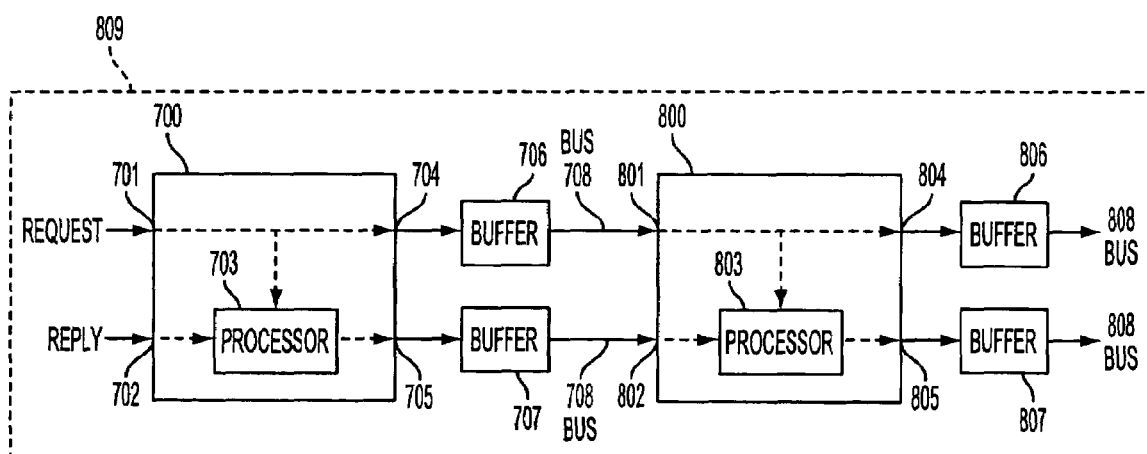
FIG. 8 is a block diagram of a first embodiment of a cascaded system on a semiconductor chip using the FIG. 7a pipelined device.

Turning to FIG. 8, the device 700 of FIG. 7a is depicted in an embodiment of a cascaded system of multiple devices, which may be implemented on a semiconductor chip 809. After passing through respective buffers 706, 707, the buffered outputs of device 700 are sent to output bus 708 and to a downstream device 800. The device 800 receives the request signal, buffered or not buffered, at a first input 801. The device 800 receives the reply signal, buffered or not buffered, at a second input 802. The device 800 functions similarly to device 700. A set of predetermined operations are performed with a processor 803 and the device 800 outputs an outgoing reply signal at a second output 805. This outgoing reply signal at the second output 805 is the result of the operations performed by processor 803 on the incoming request signal received at the first input 801 combined with the incoming reply signal received at the second input 802. The request signal received at the first input 801 is outputted at the first output 804 of the device 800. A first buffer 806 is programmable to buffer the outputted request signal from the first output 804. A second buffer 807 is programmable to buffer the outputted reply signal from the second output 805. The buffers 806, 807 also have programmable depths, and may be configured such that bypassing of any buffer stage is allowed. The outputs of the device 800, which may or may not be buffered by buffers 806, 807 depending on the programmed buffer depths, are connected to an output bus 808.

By buffering the output signals of device 700 before passing the results down the cascade on bus 708, results for the same instruction are properly combined. In accordance with an exemplary embodiment of the invention, buffering is required in buffers 706 and 707 when device 700 and device 800 have different operational latencies. For example, if device 700 and device 800 were in the same group of devices having substantially identical latencies, buffering would be unnecessary. Buffering is performed at a boundary between devices where the request and reply signals are not aligned. Request and reply signals are not aligned at the boundary between two adjacent devices in a cascade where the two devices have different latencies in performing their individual sets of operations. Either the request or the reply output is buffered depending on which device has a lower latency, in other words, is faster in performing its set of operations. If device 800 has a lower latency than device 700, then buffer 706 buffers the outputted request signal from output 704. If device 800 has a higher latency than device 700, then buffer 707 buffers the outputted reply signal from output 705. Typically, when one of the buffers 706, 707 has a programmed depth to buffer the incoming signal, the other one of the buffers bypasses at least one of its stages and may pass its signal through without buffering (if desired). This ensures that request and reply signals are aligned before outputting to a subsequent device in the cascade.

In a system where devices 700 and 800 are CAM devices in a cascaded system of multiple CAM devices, processor 703 of device 700 generates a search hit index to be included in the outgoing reply signal output at output 705 when no upstream device has registered a hit. Processor 803 of device 800 subsequently generates a search hit index to be included in the outgoing reply signal output at output 805 when no upstream device, including device 700, has registered a hit. If a match between an input comparand with stored data is found in any device in the cascade, that device's processor inserts a search hit index and a reply signal with that hit index is passed downstream from device to device through all subsequent CAM devices in the cascade. All subsequent devices in the cascade, meaning all lower priority devices to the device which registered a search hit, passes the reply signal with the hit index unchanged down the cascade. The present invention may be used to align request and reply signals between these cascaded CAM devices.

Figure 9:
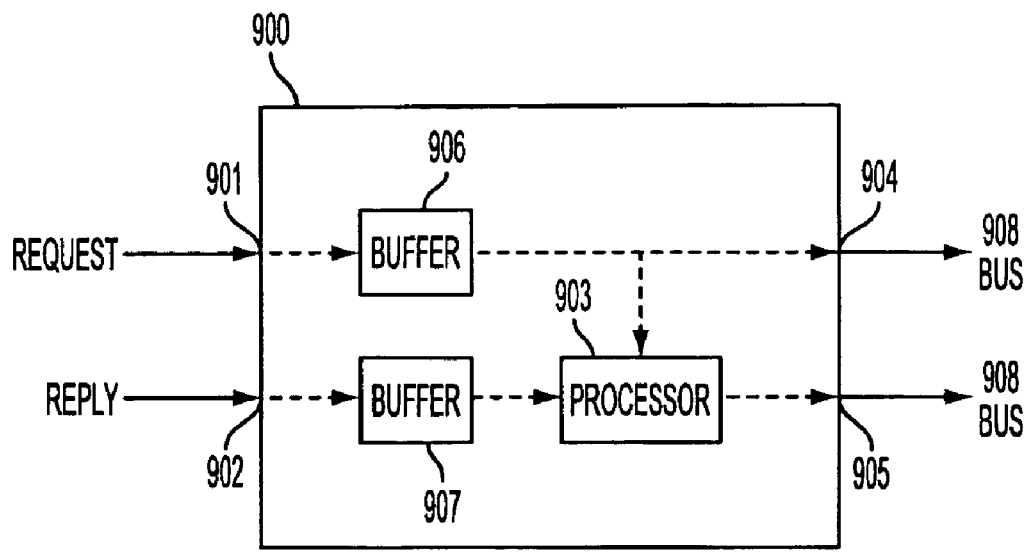
FIG. 9 is a block diagram of a pipelined device in accordance with a third exemplary embodiment of the invention.

A third exemplary embodiment of a cascaded device is shown in FIG. 9. Buffer 906 and buffer 907 are both internal to device 900. The device 900 receives a request signal at a first input 901 and an incoming reply signal at a second input 902. The received request signal is sent through buffer 906 and then to a processor 903. The incoming reply signal is sent through buffer 907 and then to the processor 903. In this embodiment, the buffers 906, 907 are upstream of the processor 903 and perform buffering on either the request signal or the incoming reply signal prior to the processor 903 performing operations. The buffers 906, 907 ensure that the processor 903 receives the request signal at a time such that the incoming reply signal is proper for the current request instruction on the live cycle. The device 900 performs a set of predetermined operations in the processor 903 and outputs an outgoing reply signal at output 905. The outgoing reply signal is the result of the performed operations in processor 903 combined with the incoming reply signal. The buffered received request signal is output from the device 900, at output 904, to an output bus 908. The bus 908 also receives the outgoing reply signal from output 905. The buffers 906, 907 are of programmable depths, and may be configured such that bypassing of any buffer stage is allowed. By using buffers of programmable depths, the received request signal or the incoming reply signal may pass through buffers 906, 907, respectively, without being buffered at all or buffered for a predetermined period of time depending on the programmed buffer depth.

Figure 10:
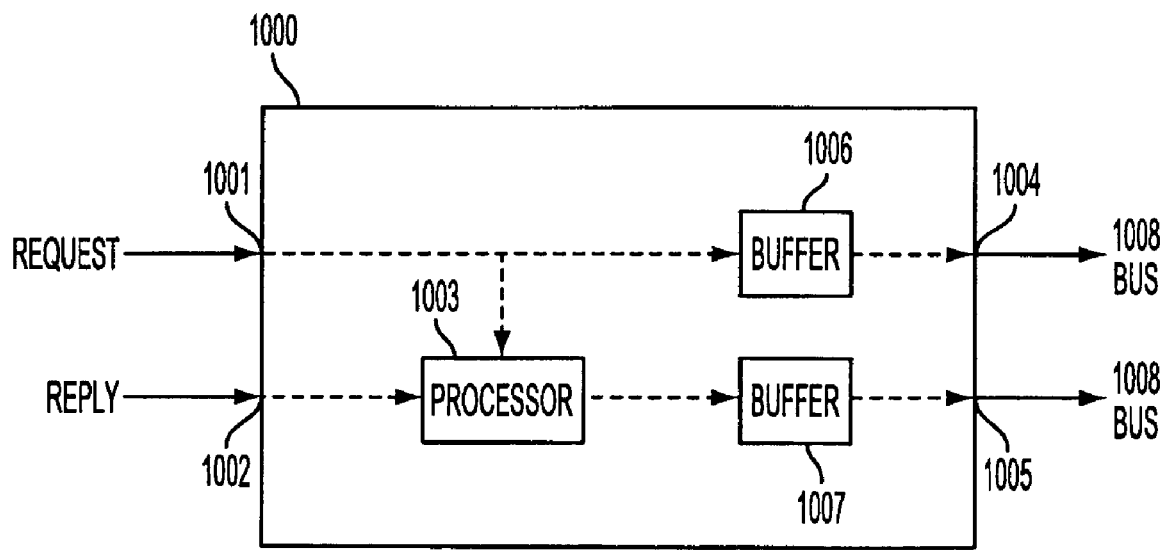
FIG. 10 is a block diagram of a pipelined device in accordance with a fourth exemplary embodiment of the invention.

A fourth exemplary embodiment of a cascaded device is shown in FIG. 10. This embodiment is similar to the embodiment shown in FIG. 7a with an exception that buffer 1006 and buffer 1007 are both internal to device 1000.

Figure 11:
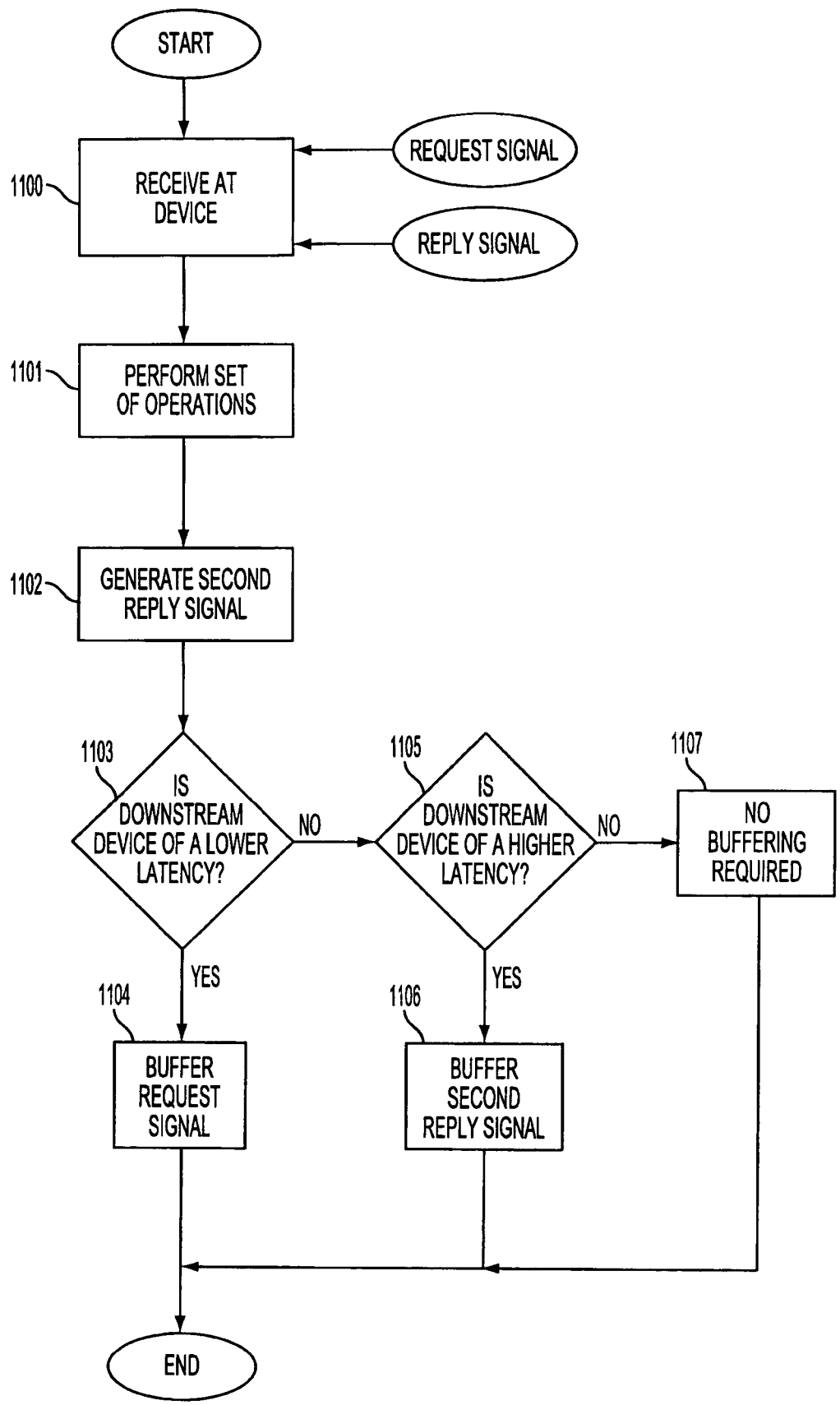
FIG. 11 is a flowchart depicting operation of the FIG. 7a exemplary embodiment of the invention.

A flowchart depicting an exemplary process embodiment for operating a cascaded system is shown in FIG. 11. A request signal and a reply signal are received at a device at segment 1100. A set of predetermined operations are then performed at segment 1101. A second reply signal is generated at segment 1102. At segment 1103, a determination is made as to whether the immediate downstream device has a latency lower than the device performing the process. If the immediate downstream device has a lower latency, and the process gets a "yes" result, then the process goes to segment 1104 where the request signal is buffered. Otherwise the process goes to segment 1105 where a determination is made as to whether the immediate downstream device has a higher latency. If so, and the process gets a "yes" result, then the process goes to segment 1106 where the second reply signal is buffered. Otherwise, the process goes to segment 1107 where no buffering is required. In segment 1105, if the downstream device has the same latency, then buffering is also not required. This process eliminates signal contention in a cascaded system by buffering request and reply signals exchanged between adjacent devices of the system.

Figure 12A:
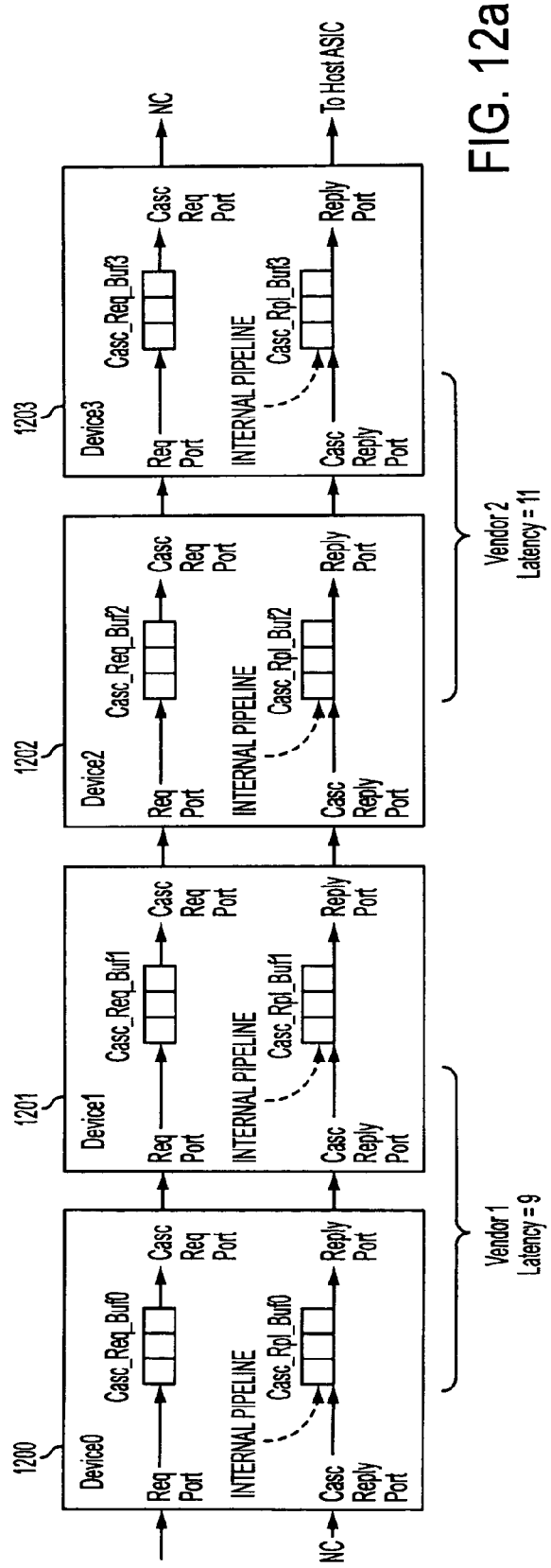
FIG. 12a is a block diagram of a second embodiment of a cascaded system having different latencies.

FIG. 12a shows a block diagram of a second embodiment of a cascaded system of multiple devices 1200, 1201, 1202, 1203 depicting two groups of devices from different vendors having different latencies within each group. The first group of Device0 1200 and Device1 1201 has a lower latency than the second group of Device2 1202 and Device3 1203.

Device0 1200 and Device1 1201 are manufactured by the same vendor and have the same latency Lp of 9 units (e.g. clock cycles). Device2 1202 and Device3 1203 are manufactured by another vendor and have the same latency Lp of 11 units. Devices within a group having similar latencies do not require buffering of request and reply signals. No buffering is required by Device0 1200 before the request and reply signals are sent to Device1 1201. The buffer depths for Device0 are programmed to be 0 such that the outputs are not buffered. The depth of the buffer on the request output line Casc_Req_Buf0 is programmed to a value of 0. Likewise, the depth of the buffer on the reply output line Casc_Rp1_Buf0 is also programmed to a value of 0.

Similarly, no buffering is required by Device2 1202 before the request and reply signals are sent to Device3 1203. The buffer depths for Device2 are programmed to be 0 such that the outputs are not buffered. The depth of the buffer on the request output line Casc_Req_Buf2 is programmed to a value of 0. Likewise, the depth of the buffer on the reply output line Casc_Rp1_Buf2 is also programmed to a value of 0. Device3 1203 is at the end of the cascade and outputs its signal to a host ASIC controller. Buffering is not required in this case at the final device in the cascade, and the buffer depths of both buffers on the request and reply output lines Casc_Req_Buf3 and Casc_Rp1_Buf3 are programmed to a value of 0. Thus, the program for the buffer depths in this system would be:

Casc_Req_Buf0=0, Casc_Rp1_Buf0=0, Casc_Req_Buf1=0, Casc_Rp1_Buf1=2,
Casc_Req_Buf2=0, Casc_Rp1_Buf2=0, Casc_Req_Buf3=0, Casc_Rp1_Buf3=0.

At the boundary between Device1 1201 and Device2 1202, buffering is required to align the request and reply signals. Device1 1201 has a latency Lp of 9 units, while Device2 1202 has a latency Lp of 11 units. The difference in latency between these two devices is 11−9=2. Because Device2 1202 has a higher latency Lp than Device1 1201, the reply signal needs to be buffered by the latency difference value of 2. The depth of the buffer on the reply output line Casc_Rp1_Buf1 of Device1 1201 is programmed to a value of 2 and the depth of the buffer on the request output line Casc_Req_Buf1 of Device1 1201 is programmed to a value of 0. Programming the buffer depths with these value aligns the request and reply signals at the boundaries between each device in the cascade.

Figure 12B:
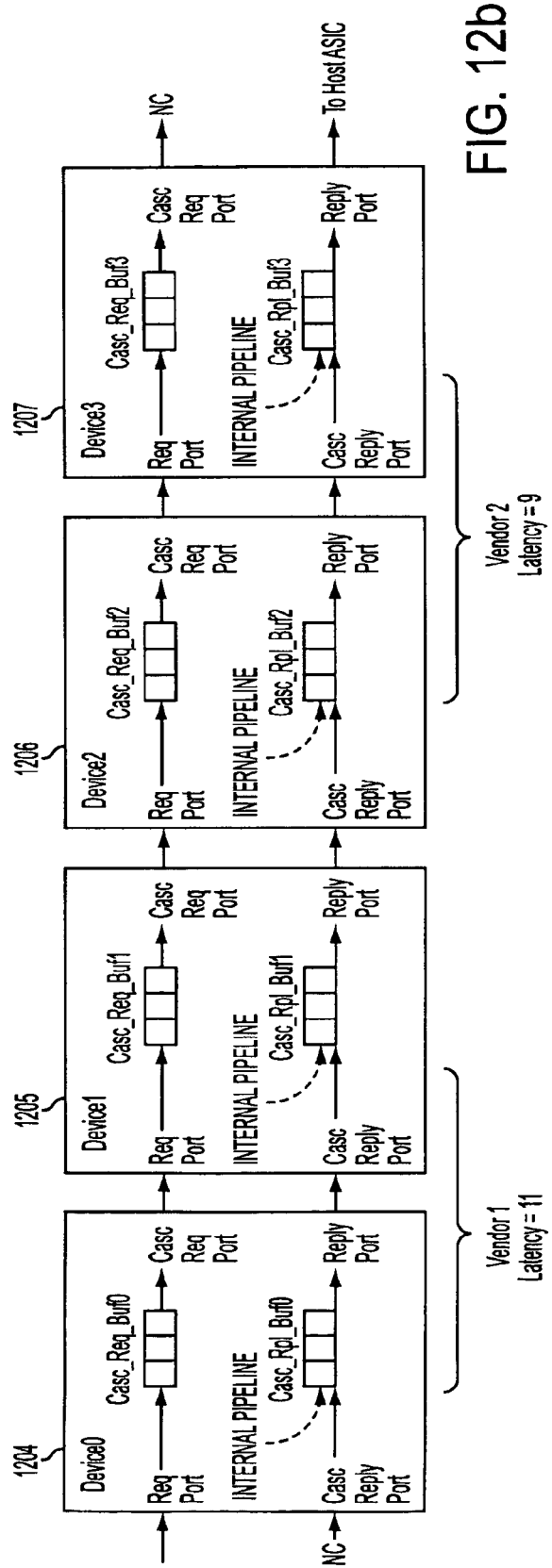
FIG. 12b is a block diagram of a third embodiment of a cascaded system of pipelined devices having different latencies.

FIG. 12b shows a block diagram of a third embodiment of a cascaded system of multiple devices depicting two groups of devices from different vendors having different latencies within each group. The first group of Device0 1200 and Device1 1201 has a higher latency than the second group of Device2 1202 and Device 3 1203.

The devices in FIG. 12b are configured similarly to the devices of FIG. 12a. The buffer depths in the cascade of FIG. 12b are programmed similarly to those of FIG. 12a with the exception of the buffer depths in Device1 1205 to align the reply and request signals at the boundary between Device1 1205 and Device2 1206. In FIG. 12b, Device0 1204 and Device1 1205 are manufactured by the same vendor and have the same latency Lp of 11. Device2 1206 and Device3 1207 are manufactured by another vendor and have the same latency Lp of 9. At the boundary between Device1 1205 and Device2 1206, buffering is required to align the request and reply signals. Device1 1205 has a latency Lp of 11, while Device2 1202 has a latency Lp of 9. The difference in latency between these two devices is 11−9=2. Because Device2 1206 has a lower latency Lp than Device1 1205, the request signal needs to be buffered by the latency difference value of 2. The depth of the buffer on the reply output line Casc_Req_Buf1 of Device1 1205 is programmed to a value of 2 and the depth of the buffer on the request output line Casc_Rp1_Buf1 of Device1 1205 is programmed to a value of 0. The program for the buffer depths in this system would be:

Casc_Req_Buf0=0, Casc_Rp1_Buf0=0, Casc_Req_Buf1=2, Casc_Rp1_Buf1=0,
Casc_Req_Buf2=0, Casc_Rp1_Buf2=0, Casc_Req_Buf3=0, Casc_Rp1_Buf3=0.

Programming the buffer depths with these values aligns the request and reply signals at the boundaries between each device in the cascade.

Figure 13:
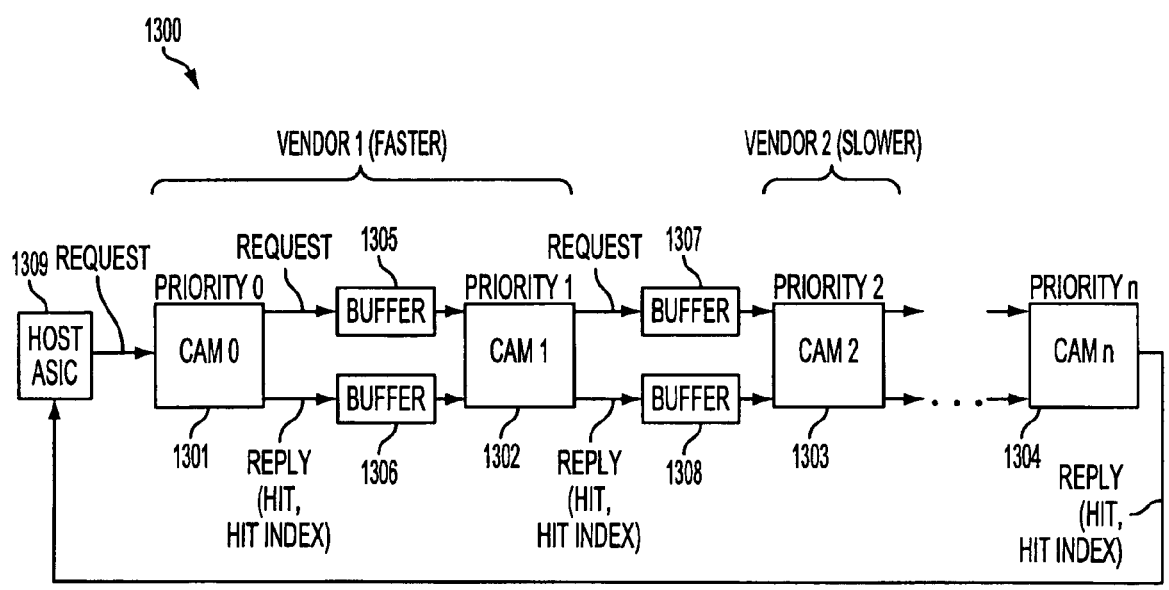
FIG. 13 is a block diagram of a fourth embodiment of a cascaded system employing CAM devices.

A block diagram of an exemplary embodiment of a system 1300 of cascaded CAM devices 1301, 1302, 1303, 1304 employing the present invention is shown in FIG. 13. CAM0 1301 and CAM1 1302 are CAM devices from the same vendor with the same operational latencies. Of course, CAM devices from different vendors may also have latencies of equal values, and CAM devices from the same vendor may have different latencies. CAM0 1301 receives a request signal from the host ASIC device 1309, passes that request signal through, performs a search based on the request signal, and generates a reply signal from the search result. The request signal and reply signal from CAM0 1301 are sent down the cascade to CAM1 1302 without the need to buffer with buffers 1305, 1306 at the boundary between CAM0 1301 and CAM1 1302. Buffering with buffers 1307, 1308 is necessary at the boundary between CAM1 1302 and CAM2 1303 because CAM2 1302 is from a different vendor with a higher latency, thus is a slower device. Each CAM device has a priority index and the priority index for each CAM device decreases traveling downstream down the cascade. When an address match is found in a CAM device between data in the respective comparand and data stored in the respective CAM device then a hit occurs and that CAM device inserts a hit index only into the reply stream. However, the CAM device may insert a hit index if no upstream CAM devices of a higher priority have registered a hit. The last CAM device in the cascade, CAMn 1304, sends its reply signal back to the host ASIC device 1309 to complete the cascade processing.

Figure 14:
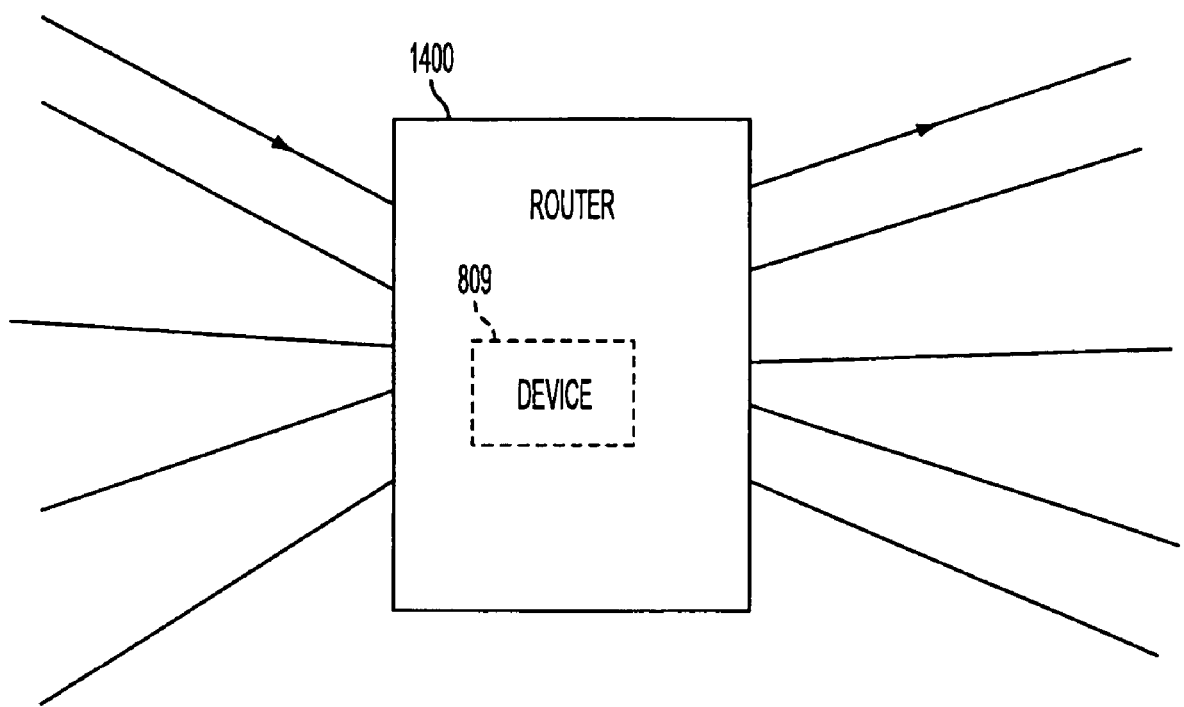
FIG. 14 depicts a simplified block diagram of a packet router employing the FIG. 8 memory chip in accordance with another exemplary embodiment of the invention.

FIG. 14 is a simplified block diagram of an embodiment of a packet router 1400 as may be used in a communications network, such as, e.g., part of the Internet backbone. The router 1400 contains a plurality of input lines and a plurality of output lines. When data is transmitted from one location to another, it is sent in a form known as a packet. Oftentimes, prior to the packet reaching its final destination, that packet is first received by a router, or some other device. The router 1400 then decodes that part of the data identifying the ultimate destination and decides which output line and what forwarding instructions are required for the packet.

Generally, devices such as CAMs are very useful in router applications because historical routing information for packets received from a particular source and going to a particular destination is stored in the CAM of the router. As a result, when a packet is received by the router 1400, the router already has the forwarding information stored within its CAM. Therefore, only that portion of the packet that identifies the sender and recipient need be decoded in order to perform a search of the CAM to identify which output line and instructions are required to pass the packet onto a next node of its journey.

Still referring to FIG. 14, router 1400 contains the added benefit of employing a semiconductor memory chip containing an array of cascaded CAM devices, such as semiconductor chip 809 depicted in FIG. 8.

Figure 15:
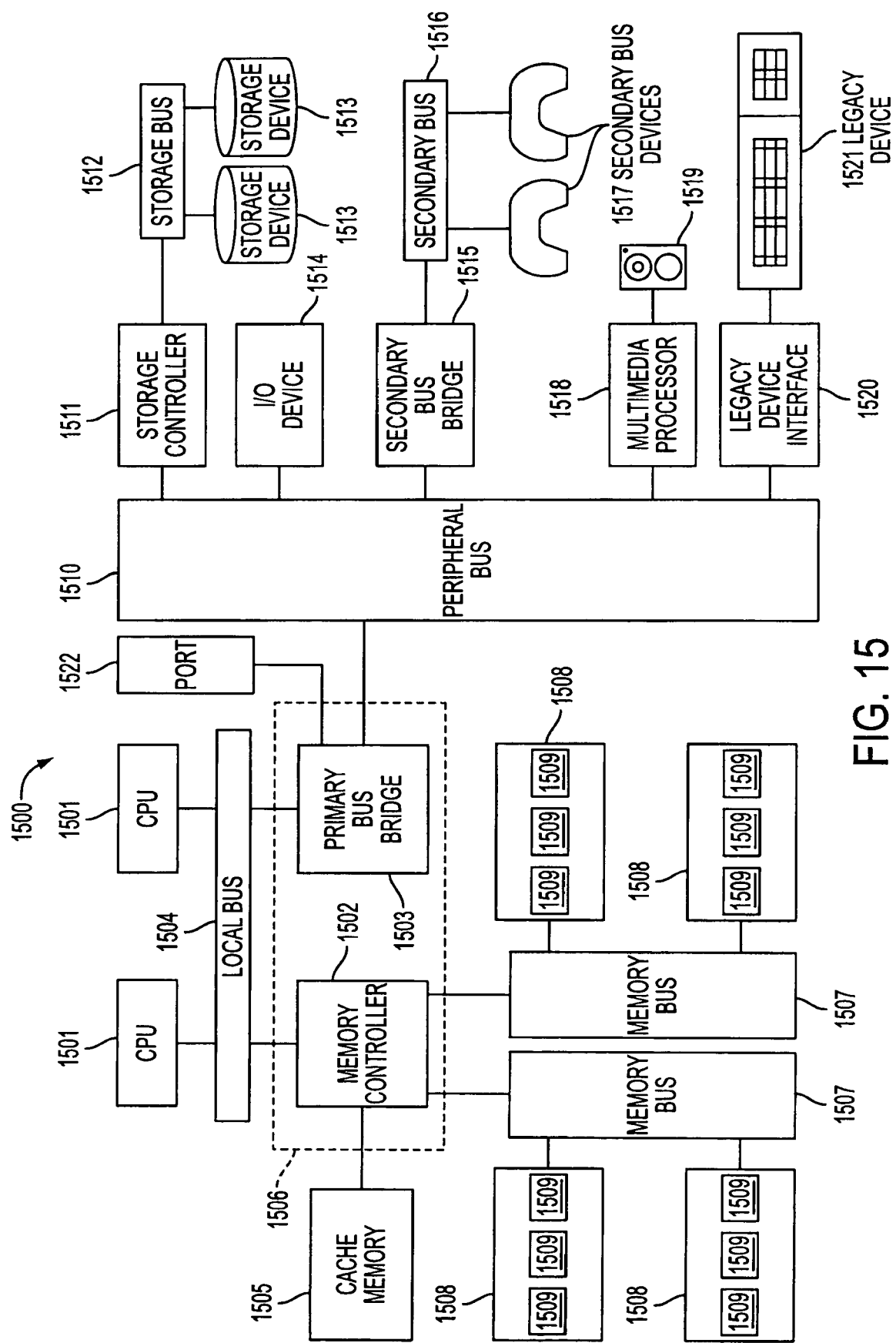
FIG. 15 depicts a block diagram of a processor system in accordance with another exemplary embodiment of the invention.

FIG. 15 illustrates an exemplary processing system 1500 that utilizes a cascade of devices including for example, the devices 700 and 800, which are located on semiconductor chip 809 of FIG. 8. The processing system 1500 includes one or more processors 1501 coupled to a local bus 1504. A memory controller 1502 and a primary bus bridge 1503 are also coupled the local bus 1504. The processing system 1500 may include multiple memory controllers 1502 and/or multiple primary bus bridges 1503. The memory controller 1502 and the primary bus bridge 1503 may be integrated as a single device 1506.

The memory controller 1502 is also coupled to one or more memory buses 1507. Each memory bus accepts memory components 1508. Any one of memory components 1508 may contain cascaded devices containing devices such as any of the devices described in connection with FIGS. 7-13.

The memory components 1508 may be a memory card or a memory module. The memory components 1508 may include one or more additional devices 1509. For example, in a SIMM or DIMM, the additional device 1509 might be a configuration memory, such as a serial presence detect (SPD) memory. The memory controller 1502 may also be coupled to a cache memory 1505. The cache memory 1505 may be the only cache memory in the processing system. Alternatively, other devices, for example, processors 1501 may also include cache memories, which may form a cache hierarchy with cache memory 1505. If the processing system 1500 include peripherals or controllers which are bus masters or which support direct memory access (DMA), the memory controller 1502 may implement a cache coherency protocol. If the memory controller 1502 is coupled to a plurality of memory buses 1507, each memory bus 1507 may be operated in parallel, or different address ranges may be mapped to different memory buses 1507.

The primary bus bridge 1503 is coupled to at least one peripheral bus 1510. Various devices, such as peripherals or additional bus bridges may be coupled to the peripheral bus 1510. These devices may include a storage controller 1511, an miscellaneous I/O device 1514, a secondary bus bridge 1515, a multimedia processor 1518, and an legacy device interface 1520. The primary bus bridge 1503 may also coupled to one or more special purpose high speed ports 1522. In a personal computer, for example, the special purpose port might be the Accelerated Graphics Port (AGP), used to couple a high performance video card to the processing system 1500.

The storage controller 1511 couples one or more storage devices 1513, via a storage bus 1512, to the peripheral bus 1510. For example, the storage controller 1511 may be a SCSI controller and storage devices 1513 may be SCSI discs. The I/O device 1514 may be any sort of peripheral. For example, the I/O device 1514 may be an local area network interface, such as an Ethernet card. The secondary bus bridge may be used to interface additional devices via another bus to the processing system. For example, the secondary bus bridge may be an universal serial port (USB) controller used to couple USB devices 1517 via to the processing system 1500. The multimedia processor 1518 may be a sound card, a video capture card, or any other type of media interface, which may also be coupled to one additional device such as speakers 1519. The legacy device interface 1520 is used to couple legacy devices, for example, older styled keyboards and mice, to the processing system 1500.

The processing system 1500 illustrated in FIG. 15 is only an exemplary processing system with which the invention may be used. While FIG. 15 illustrates a processing architecture especially suitable for a general purpose computer, such as a personal computer or a workstation, it should be recognized that well known modifications can be made to configure the processing system 1500 to become more suitable for use in a variety of applications. For example, many electronic devices which require processing may be implemented using a simpler architecture which relies on a CPU 1501 coupled to memory components 1508 and/or memory devices 1509. The modifications may include, for example, elimination of unnecessary components, addition of specialized devices or circuits, and/or integration of a plurality of devices.

While certain embodiments of the invention have been described and illustrated above, the invention is not limited to these specific embodiments as numerous modifications, changes and substitutions of equivalent elements can be made without departing from the spirit and scope of the invention. For example, although the invention has been described in connection with specific circuits employing different configurations of devices with buffers, the invention may be practiced with many other configurations without departing from the spirit and scope of the invention. In addition, although the invention is described in connection with CAM devices, it should be readily apparent that the invention may be practiced with any type of device. Accordingly, the scope of the present invention is not to be considered as limited by the specifics of the particular structures and processes which have been described and illustrated herein, but is only limited by the scope of the appended claims.

What is claimed as new and desired to be protected by Letters Patent of the United States is:

1. A system of cascaded devices, comprising:
   a first device having a first input for receiving a request signal from a first source, a second input for receiving a first reply signal from said first source, a first output for outputting said request signal, and a second output for outputting a second reply signal;
   a first buffer having a first programmable buffer stage depth comprising a first number of buffer stages, wherein when the first number of buffer stages is greater than zero, the first buffer is coupled to said first device for receiving said outputted request signal and when the first number of buffer stages is zero, the first buffer is not coupled to said first device and does not receive said outputted request signal; and
   a second buffer having a second programmable buffer stage depth comprising a second number of buffer stages, wherein when the second number of buffer stages is greater than zero, the second buffer is coupled to said first device for receiving said second reply signal and when the second number of buffer stages is zero, the second buffer is not coupled to said first device and does not receive said second reply signal.

2. The system of claim 1, further comprising an output bus, said output bus being coupled to said first and second buffers and to a second device.

3. The system of claim 2, wherein said first buffer buffers said outputted request signal when said second device has a lower latency than said first device.

4. The system of claim 2, wherein said first device and said second device are content addressable memory (CAM) devices.

5. The system of claim 1, wherein said second reply signal is generated from said request signal and said first reply signal.

6. The system of claim 2, wherein said second buffer buffers said second reply signal when said second device has a higher latency than said first device.

7. The system of claim 1, wherein said first and second buffers are part of a same buffer unit.

8. The system of claim 1, wherein the first programmable buffer stage depth is different than the second programmable buffer stage depth.

9. The system of claim 1, wherein the first programmable buffer stage depth is the same as the second programmable buffer stage depth.

* * * * *

UNITED STATES PATENT AND TRADEMARK OFFICE
CERTIFICATE OF CORRECTION

PATENT NO. : 7,634,597 B2  Page 1 of 1
APPLICATION NO. : 10/680171
DATED : December 15, 2009
INVENTOR(S) : Tom Teng It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 742 days.

Signed and Sealed this

Ninth Day of November, 2010

David J. Kappos
*Director of the United States Patent and Trademark Office*